United States Patent
Brueske et al.

(10) Patent No.: US 6,987,423 B2
(45) Date of Patent: Jan. 17, 2006

(54) TWO PORT VOLTAGE CONTROLLED OSCILLATOR FOR USE IN WIRELESS PERSONAL AREA NETWORK SYNTHESIZERS

(75) Inventors: Daniel E. Brueske, Fort Lauderdale, FL (US); David B. Harnishfeger, Chandler, AZ (US); Stephen T. Machan, Oakland Park, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 113 days.

(21) Appl. No.: 10/643,310

(22) Filed: Aug. 19, 2003

(65) Prior Publication Data

US 2005/0040906 A1 Feb. 24, 2005

(51) Int. Cl.
*H03L 7/00* (2006.01)
(52) U.S. Cl. .................. 331/36 C; 331/185; 331/74; 331/77; 331/16; 331/177 V; 331/135; 327/268; 327/276; 327/283
(58) Field of Classification Search .............. 331/185, 331/74, 77, 36 C, 16, 177 V, 135; 327/268, 327/276, 283

See application file for complete search history.

(56) References Cited

U.S. PATENT DOCUMENTS

| | | | |
|---|---|---|---|
| 5,880,631 A * | 3/1999 | Sahota | 330/51 |
| 6,011,443 A | 1/2000 | Chen et al. | |
| 6,175,279 B1 * | 1/2001 | Ciccarelli et al. | 330/296 |
| 6,304,149 B1 | 10/2001 | Kim | |
| 6,348,839 B1 | 2/2002 | Aramaki | |
| 6,566,970 B2 * | 5/2003 | Ingino, Jr. | 331/57 |
| 6,803,831 B2 * | 10/2004 | Nishikido | 331/57 |
| 2002/0014925 A1 * | 2/2002 | Ochiai | |

* cited by examiner

*Primary Examiner*—Michael B Shingleton
(74) *Attorney, Agent, or Firm*—Miller Johnson

(57) ABSTRACT

A voltage controlled oscillator (VCO) for use in a personal area network synthesizer includes a delay cell (100), a first current amplifier (201, 203) for amplifying an input current, a resister capacitor (RC) tuning network (207, 209, 211) for varying the amount of amplification and delay of an output of the first current amplifier. A second current amplifier (213, 215) is then used for amplifying an output current from the RC tuning network. The invention includes a unique composite voltage variable capacitor (CVVC) (300) for precisely tuning the amount of delay presented by the delay cell. The unique topology of the delay cell (100) allows it to be readily used in voltage controlled oscillators (VCOs) operable at frequencies above 1 GHz.

21 Claims, 3 Drawing Sheets

TWO PORT VOLTAGE CONTROLLED OSCILLATOR FOR USE IN WIRELESS PERSONAL AREA NETWORK SYNTHESIZERS

TECHNICAL FIELD

This invention relates in general to radio frequency synthesizers and more particularly to a voltage controlled oscillator (VCO) topology operable above 1 GHz.

BACKGROUND

Wireless personal area networks (WPAN) are those networks generally used for interconnecting devices centered around people where the connections are wireless. Because most personal area networks are wireless, the acronym WPAN and the term "wireless network" often are considered to be virtually synonymous. Generally, a wireless personal area network uses technology that permits communication over a very short range, typically 10 meters or less. One common example of this technology is 802.15.4, which is a standard developed by the Institute of Electrical and Electronics Engineers (IEEE).

As is well known in the art, a WPAN can serve to interconnect all the ordinary personal computing and communicating devices that many people carry with them today. Moreover, WPAN can also serve a more specialized purpose such as allowing a surgeon and other medical team members to communicate during an operation. A key concept in WPAN technology is known as "plugging-in." In the ideal scenario, when any two WPAN-equipped devices come into close proximity (within several meters of each other) or within a few kilometers of a central server, they can communicate as if connected through a wired connection. Still another important feature of WPAN is the ability of each device to selectively lock out other devices, preventing unwanted interference or unauthorized access to information.

Currently, technology for WPAN devices and systems is in its infancy and is undergoing rapid development with a proposed operating frequency at approximately 2.4 GHz in digital modes. The ultimate objective of this technology is to facilitate seamless operation among home or business devices and their networking systems. In an ideal scenario, every device in a WPAN shall be able to plug in to any other device in the same WPAN, provided they are within physical range of one another. In addition, WPANs worldwide shall be interconnected. As one example, an archeologist on site in Greece might use a personal digital assistant (PDA) to directly access databases at the University of Michigan in Ann Arbor, Mich., and to transmit findings to that database.

Radio frequency (RF) technology enabling WPAN-equipped devices to interconnect can be very complex. Operation at frequencies at and above 1 GHz requires specialized RF circuit topologies for fast and reliable operation. One such circuit topology that can present a problem at these frequencies is the voltage controlled oscillator or "VCO." As seen in prior art FIG. 1, a block diagram of the VCO typically is arranged in a loop configuration where a series of delay cells are used to offer both gain and phase delay. As is well known by those skilled in the art, this type of configuration is also commonly referred to as a "ring oscillator." The delay cells are used to provide both in-phase (I) and quadrature (Q) digital output signals at some time later than the input signal applied to the VCO. The output signal is inverted and fed back to the input of the delay cells. This in turn causes the circuit to oscillate in view of a 180 degree phase shift between input and output.

The topology of the VCO delay cell has offered interesting challenges when requiring it to operate at frequencies above 1 GHz. Prior art FIGS. 2 and 3 illustrate both a current starved ring oscillator delay cell and a non-linear resistive capacitive (RC) type delay cell. Both of these types of circuit topologies operate in a voltage mode controlled by the voltage gain ($G_m$) of the amplifier used in their respective circuits. These commonly used delay cell topologies are adequate for frequencies under 1 GHz, however, the VCOs used with these types of delay cells do not offer adequate frequency range when operating on or around 2.4 GHz. A VCO such as that shown in FIG. 3 will have a small to medium level of tuning range because of the limited resistive load variation set by the metal oxide semiconductor field effect transistor (MOSFET) operating in the triode region. By way of example, U.S. Pat. No. 6,011,443 shows a complementary metal oxide semiconductor (CMOS) VCO that includes a voltage-to-current converter for generating reference currents. This type of circuit causes each of the load metal oxide semiconductor (MOS) transistors to operate in the triode region and suffers from all of the inherent drawbacks mentioned herein. Moreover, tank oscillators which require an inductor and capacitor to oscillate (LC type) take up large amounts of circuit area when implemented with current integrated circuit (IC) technology, and generally require additional processing steps during the manufacturing process.

Thus, the need exists to provide a new circuit topology for a high frequency VCO using delay cells operable at frequencies in the WPAN IEEE 802.15.4 standard. The new invention should be capable of being implemented in an all CMOS technology operable on or about 2.4 GHz. The device should use no internal or external inductors that would require additional cost and IC surface area. Moreover, the VCO should be capable of tuning over all process, temperature, and supply voltage corners such that its operational voltage remains within a few decibels (dB) of a nominal value.

SUMMARY OF THE INVENTION

Briefly, according to the invention, there is provided a two port ring oscillator type VCO that uses delay cells to operate nominally at approximately 2.4 GHz in a WPAN or other high frequency networking RF system. In a ring oscillator, the delay cells operate to cause a phase shift in the signal and, if sufficiently large, causes the ring oscillator to oscillate. The invention includes presenting the delay cells with a non-linear dynamic load which improves the center frequency by approximately 30–40 percent while maintaining substantially the same current drain and sideband noise specification. In addition, metal oxide semiconductor field effect transistors (MOSFETs) can be used to control the center frequency and tuning sensitivity ($K_v$) over process, temperature, and supply voltage.

The use of multi-biased MOSFETs helps to reduce the non-linearity in $K_v$ curves versus tuning voltage. In that inductors are not used in the VCO, the center frequency will vary approximately 20 percent more over process as compared with a typical inductor-capacitor (LC) type ring VCO. This increases the coarse tuning of the center frequency over a substantially larger range than an LC type oscillator. This is accomplished not only through tuning and programming MOSFET caps, but also by using successive VCOs on the same die with differently designed center frequencies. Consequently, switching times between the VCOs during coarse tune is critical in that the coarse tune will increment through successive ring oscillators and must be very quick. Hence, the invention further includes bypassing the filter between the bias and VCO with a MOSFET switch in order for the time constant of the turn-off and on of the VCO from becoming unacceptably large. The filter as described herein is essential to maintaining low sideband noise in the VCO for preventing the bias circuitry from dominating the sideband noise. It is the combination of these novel techniques which enables a low-cost, highly-integrated, all-complementary, metal oxide semiconductor (CMOS) WPAN VCO for use at frequencies above 1 GHz.

BRIEF DESCRIPTION OF THE DRAWINGS

The features of the present invention, which are believed to be novel, are set forth with particularly in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
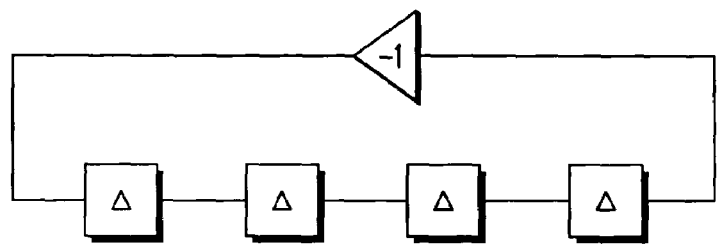
FIG. 1 is a prior art block diagram of a ring oscillator type VCO including a series of delay cells.
Figure 2:
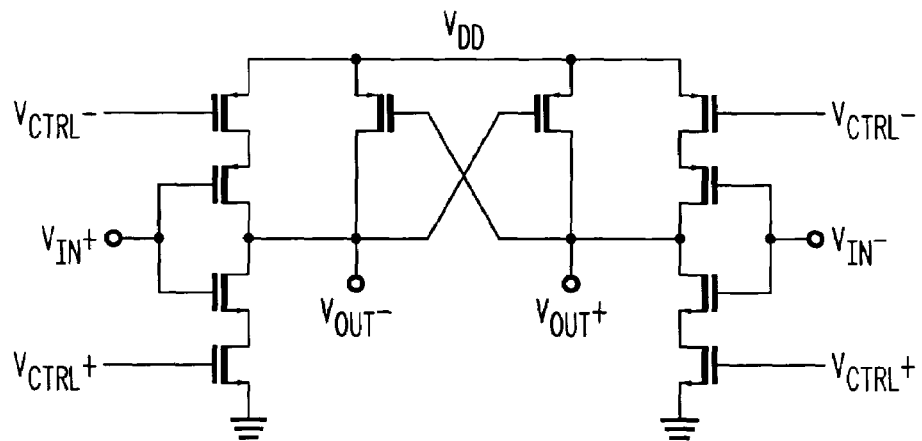
FIG. 2 is a prior art circuit diagram of a current starved ring oscillator delay cell.
Figure 3:
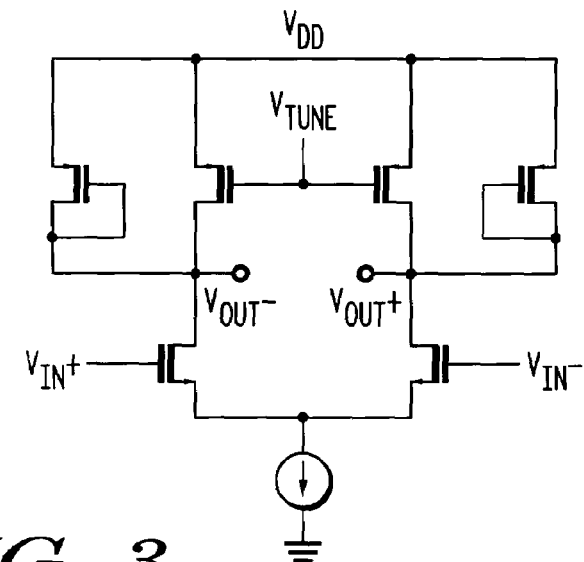
FIG. 3 is a prior art circuit diagram of a non-linear resister-capacitor (RC) type ring oscillator delay cell.

While the specification concludes with claims defining the features of the invention that are regarded as novel it is believed that the invention will be better understood from a consideration of the following description in conjunction with the drawing figures, in which like reference numerals are carried forward.

Figure 4:
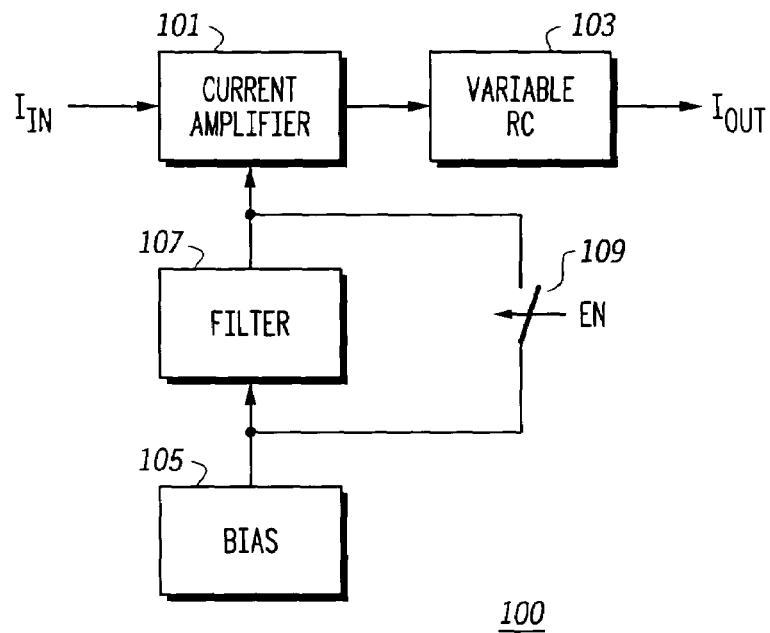
FIG. 4 is a block diagram of a two port VCO using a delay cell for use with a UHF WPAN synthesizer according to the preferred embodiment of the invention.

Referring now to FIG. 4, a two port voltage controlled oscillator using a delay cell operable with a high frequency wireless personal area network (WPAN) synthesizer includes a current amplifier 101 that receives an input current at input $I_{IN}$. Since it is necessary to adjust each delay cell 100 for a predetermined amount of delay and gain in order to maintain oscillation of the VCO, a variable resister-capacitor (RC) circuit 103 is used before the current is directed to output $I_{OUT}$. As discussed herein, the variable RC circuit 103 includes a plurality of resistors and capacitors in order to adjust both gain and delay of the delay cell 100 in order to provide optimum operation of the VCO above approximately 1 GHz. In order to ensure that the delay cell 100 operates with low noise, the biasing network 105 includes a filter network 107 that acts to eliminate circuit noise that might enter the current amplifier 101. In order that the variable RC circuit 103 of the delay cell might be tuned more quickly, a switch 109 is provided so that the filter network 107 may be selectively bypassed. As will be evident to those skilled in the art, during the tuning mode it is not necessary for the VCO to operate in a low noise mode. Therefore, the filter network 107 may be bypassed enabling the VCO to be more rapidly tuned.

Figure 5:
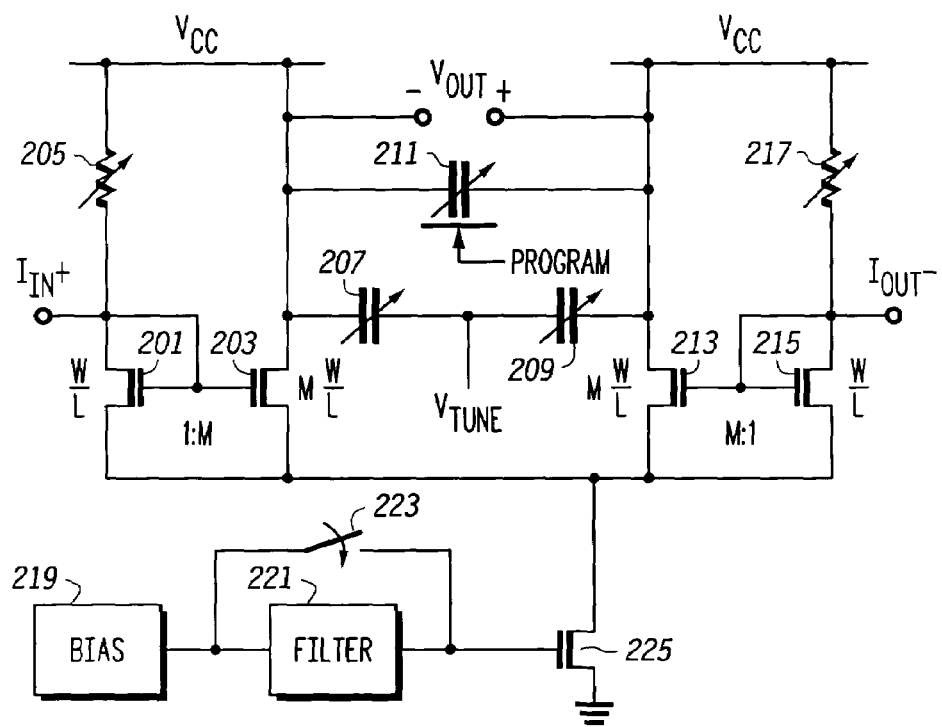
FIG. 5 is a circuit diagram for the two port VCO as shown in FIG. 4.

FIG. 5 illustrates the circuit topology of the VCO as seen in FIG. 4. A differential input current is presented to the input as $I_{IN}$ such that $I_{IN}=I_{IN}^+ - I_{IN}^-$ where the input amount is amplified using a first gain stage comprised of FETs 201, 203, 213 and 215. A supply voltage ($V_{CC}$) supplies voltage to the first gain stage which is configured like a current mirror only with the source of each pair connected at a common point such as a differential pair. The differential current is amplified by the ratio M which is set by the ratio of width over length of pairs 201 and 203, and 215 and 213. The output appears as a differential voltage, $V_{OUT}$, across both the load and capacitors 211, 207 and 209. One means used to control the amplification of the first gain stage includes a first variable resistor 205 which controls signal applied to the common-gate input of the FET 201. The output of the first gain stage is then applied to a variable C circuit that is used to control the amount of delay and gain. The variable input resistors 205, 217 and variable capacitors 211, 207, and 209 then form the RC circuit which give the VCO the ability to vary the gain and delay. The variable RC circuit includes variable capacitors 207, 209 that are used for fine tuning the amount of delay in addition to a variable capacitor 211 used for coarse tuning the amount of delay. The variable capacitors may be configured as shown in FIG. 6 described herein.

As noted in FIG. 4, a biasing network 219 is used in connection with a filter 221 to provide a clean analog bias signal to control the gate of FET 225. A switch 223 is used to bypass the filter network 221 when adjusting tuning delay in order to enable the delay to be adjusted at a faster rate. Although the topology described herein is depicted with FETs, those skilled in the art will recognize that other semiconductor devices such as bipolar transistors may operate in a similar configuration as well.

Figure 6:
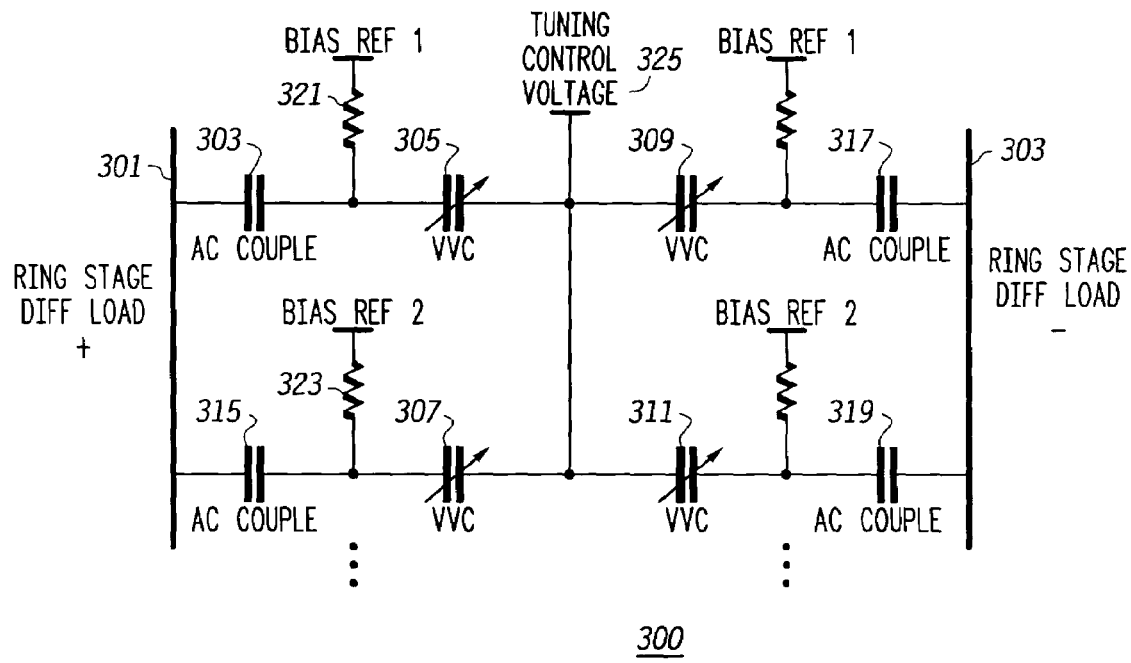
FIG. 6 is a detailed circuit diagram of a composite voltage variable capacitor (VVC) load as used in the preferred embodiment of the invention.

FIG. 6 illustrates a circuit topology of a composite voltage variable capacitance (VVC) 300 portion of the RC load. As noted above, this description may be applied to the variable capacitors 207 and 209 from FIG. 5. Differential nodes 301 and 303 comprise the differential load to the differential pair of FET transistors 203 and 213 as described in FIG. 5. The tuning control voltage node 325 corresponds to the $V_{TUNE}$ node between variable capacitors 207 and 209 as also seen in FIG. 5. Node 325 connects to the common connection of voltage variable capacitors (VVCs) 305 and 309. The opposite connections of VVCs 305 and 309 connect through biasing resistors to a common first bias reference 321.

The biasing resistors allow one set of biasing conditions to be established across VVCs 305 and 309 to create a single bias dependent capacitance loading curve that may be defined as the capacitance between the differential load nodes 301 and 303. Additional alternating current (AC) coupling capacitors 313 and 317 prevent the biasing resistors from appearing as a direct current (DC) load on nodes 301 and 303 as well as preventing biasing conditions on nodes 301 and 303 from affecting the capacitance loading curves of VVCs 305 and 309. Node 325 further connects to the common connection of VVCs 307 and 311. The opposite connections of VVCs 307 and 311 connect through biasing resistors to a common second bias reference 323. The biasing resistors allow a second set of biasing conditions to be established across VVCs 307 and 311 to create a second bias dependent capacitance loading curve as defined between the differential load nodes 301 and 303. AC coupling capacitors 315 and 319 prevent the biasing resistors from appearing as a DC load on nodes 301 and 303 as well as preventing the biasing conditions on nodes 301 and 303 from affecting the capacitance loading curves of VVCs 307 and 311. As will be further evident to those skilled in the art, additional stages may be added in a similar manner as needed to provide additional capacitance.

Figure 7:
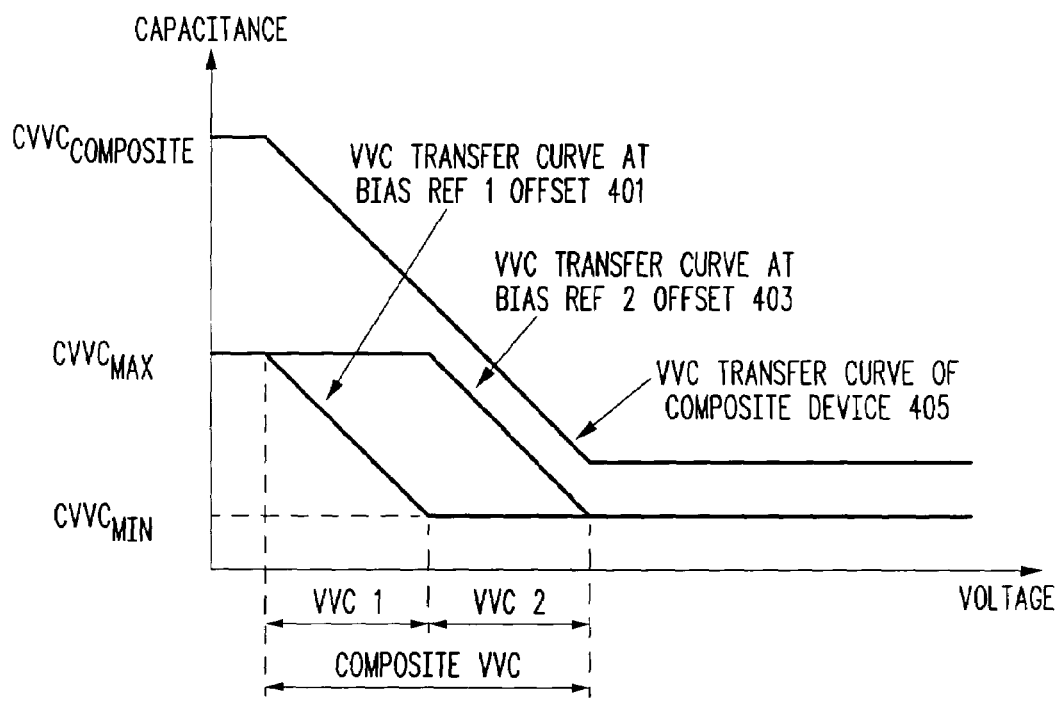
FIG. 7 is a graphical diagram illustrating the effect of staggering of the bias on multiple VVCs for producing a 'composite' VVC with a wider range.

FIG. 7 illustrates an idealized graphical representation using an approach where the bias references may be staggered to provide a wider overall "composite" capacitance loading curve than a load provided by an individual VVC. This is known as a composite voltage variable capacitance (CVVC). Curve 401 represents the capacitance loading that may be traced between differential nodes 301 and 303 in FIG. 6 by sweeping the tuning control voltage on node 325 working against the first bias reference if only VVCs 305 and 309 were connected between nodes 301 and 303 through AC coupling capacitances 313 and 317. Similarly, curve 403 represents the capacitance loading that would be traced between nodes 301 and 303 in FIG. 6. This is accomplished by sweeping the tuning control voltage on node 325 working against the second bias reference only if VVCs 307 and 311 are connected between nodes 301 and 303 through AC coupling capacitors 315 and 319. Using an appropriate choice of reference biases and using both sets of AC coupled VVCs together which presents a load to the delay cell at the same time, a condition can be created allowing the VVCs 307 and 311 to start their load curve change just as the VVCs 305 and 309 are coming to the end of their load curve change. This has the desirable effect of extending the total tune control voltage range over which the load curve is changing as demonstrated by curve 405. The combination of both pairs of VVCs, i.e., VVCs 305, 309 in conjunction with VVCs 307, 311, creates the loading effect of a single composite VVC with a much wider range. Additional VVC pairs can be added in a similar manner as needed to extend a greater range of capacitance. Indeed, VVCs can be combined in this same manner to provide a variety of loading curve shapes to meet demanding performance requirements.

Thus, in summary, the present invention provides a two port VCO that uses a delay cell and current amplifiers for amplifying an input current. One or more variable RC filters are used for varying the amount of signal delay in the VCO. The invention provides many improvements over the prior art delay cell devices including a unique VVC configuration to enable a manufacturable VCO to operate in a stable manner at frequencies above 1 GHz.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A voltage controlled oscillator (VCO) delay cell comprising:
   at least one current amplifier for amplifying an input current;
   a variable resister capacitor (RC) filter for varying the amount of signal delay in the VCO delay cell; and
   wherein the at least one current amplifier includes a first current amplifier at an input of the VCO delay cell and a second current amplifier at an output of the VCO wherein the output current of the first and second current amplifiers vary in proportion to variations in the input current to the first and second current amplifiers.

2. A VCO as in claim 1, further comprising:
   a filter for removing unwanted signal components from a biasing network.

3. A VCO as in claim 2, wherein the filter is capable of being bypassed using at least one switch.

4. A VCO as in claim 1, wherein the variable RC filter includes at least one variable capacitor for fine tuning the amount of signal delay in the VCO.

5. A VCO as in claim 1, wherein the variable RC filter includes at least one variable capacitor for coarse tuning the amount of signal delay.

6. A VCO as in claim 1, wherein the RC filter includes a composite voltage variable capacitor (VVC) for enabling the RC filter to be finely tuned.

7. A VCO as in claim 6, wherein the composite VVC utilizes a plurality of bias reference voltage and at least one tuning control voltage for adjusting a precise capacitance value.

8. A voltage controlled oscillator (VCO) delay cell including a current mode delay cell comprising:
   a first current amplifier for amplifying an input current;
   a resister capacitor (RC) tuning network for varying the amount of amplification and delay of an output of the first current amplifier;
   a second current amplifier for amplifying an output current from the RC tuning network; and
   wherein the at least one current amplifier includes a first current amplifier at an input of the VCO delay cell and a current amplifier at an output of the VCO wherein the output current of the first and second amplifiers vary in proportion to variations in the input current to the first and second current amplifiers.

9. A VCO as in claim 8, wherein the RC tuning network includes at least one variable resistor for controlling the gain of the first current amplifier and second current amplifier.

10. A VCO as in claim 8, wherein the RC tuning network includes at least one variable capacitor for fine tuning the amount of signal delay in the delay cell.

11. A VCO as in claim 8, wherein the RC tuning network includes at least one variable capacitor for coarse tuning the amount of signal delay in the delay cell.

12. A VCO as in claim 8, further comprising at least one filter for providing a low noise bias voltage from at least one bias supply.

13. A VCO as in claim 12, wherein the at least one filter is capable of being switchably bypassed from at least one bias supply.

14. A VCO as in claim 8, wherein the RC tuning network includes a composite voltage variable capacitor (VVC) for enabling the RC filter to be finely tuned.

15. A VCO as in claim 14, wherein the composite VVC utilizes a plurality of bias reference voltage and at least one tuning control voltage for adjusting the capacitance value.

16. A method for providing signal delay in a voltage controlled oscillator (VCO) using a delay cell comprising the steps of:
   amplifying an input current with at least one current amplifier;
   adjusting the amount of signal delay from the at least one current amplifier using a delay network;
   providing an adjustable delay using at least one variable resistor and at least one variable capacitor; and
   wherein the at least one current amplifier includes a first current amplifier at an input of the VCO delay cell and a second current amplifier at an output of the VCO wherein the output current of the first and second current amplifiers vary in proportion to variations in the input current to the first and second current amplifiers.

17. A method for providing signal delay in a VCO as in claim 16, further comprising the step of:
provviding a bias to the VCO delay cell using a switchable filter that is capable of being bypassed.

18. A method for providing signal delay in a VCO as in claim 16, further comprising the step of:
coarse tuning the amount of signal delay in the VCO delay cell using at least one variable resister.

19. A method for providing signal delay in a VCO as in claim 16, further comprising the step of:
fine tuning the amount of signal delay using at least one variable capacitor.

20. A method for providing signal delay as in claim 16, wherein the step of adjusting includes:
tuning a resister capacitor (RC) network using a composite voltage variable capacitor (VVC) for fine tuning the amount of signal delay.

21. A method for providing signal delay as in claim 20, wherein the composite VVC utilizes a plurality of bias reference voltages and at least one tuning control voltage for adjusting the capacitance value.

* * * * *

UNITED STATES PATENT AND TRADEMARK OFFICE
CERTIFICATE OF CORRECTION

PATENT NO. : 6,987,423 B2
APPLICATION NO. : 10/643310
DATED : January 17, 2006
INVENTOR(S) : Daniel E. Brueske et al.

It is certified that error appears in the above-identified patent and that said Letters Patent is hereby corrected as shown below:

In Column 5, Line 57, Claim 1:

Delete "delay cell" between "(VCO)" and "comprising".

In Column 6, Line 64, Claim 16:

Insert --delay cell-- after "(VCO)" at end of line.

In Column 6, Line 67, Claim 16:

Delete "current" between "second" and "amplifiers"

Signed and Sealed this

First Day of May, 2007

JON W. DUDAS
*Director of the United States Patent and Trademark Office*